(12) United States Patent
Hensley et al.

(10) Patent No.: US 6,635,513 B2
(45) Date of Patent: Oct. 21, 2003

(54) PRE-CURVED SPRING BOLSTER PLATE

(75) Inventors: James David Hensley, Rocklin, CA (US); Stephen Daniel Cromwell, Penryn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/870,044

(22) Filed: May 29, 2001

(65) Prior Publication Data

US 2002/0180039 A1 Dec. 5, 2002

(51) Int. Cl.[7] .......................... H01L 21/44; H01L 21/48; H01L 21/50
(52) U.S. Cl. .......................... 438/117; 438/121; 438/122
(58) Field of Search .......................... 257/730; 438/106, 438/109, 117, 121, 122

(56) References Cited

U.S. PATENT DOCUMENTS 6,095,008 A * 8/2000 Hitomi
6,120,006 A * 9/2000 Yamaki et al.

* cited by examiner

Primary Examiner—Olik Chaudhuri
Assistant Examiner—Khiem Nguyen

(57) ABSTRACT

A method and apparatus to mount a pre-curved bolster plate to a substrate. One embodiment of the invention involves a method to assemble a pre-curved bolster plate on a substrate. A second embodiment of the invention involves a method to fabricate a pre-curved bolster plate. A third embodiment of the invention involves an assembled substrate with a pre-curved bolster plate on the opposite side of the assembled substrate, under an electrical contact area of a component on the assembled substrate.

18 Claims, 6 Drawing Sheets

PRE-CURVED SPRING BOLSTER PLATE

BACKGROUND OF THE INVENTION

1. Field of the Invention

This invention relates generally to a bolster plate to support a substrate subject to high clamping forces for IC components, and more specifically relates to a bolster plate to support a printed circuit board assembled with one or more land grid array (LGA) IC components.

2. Description of the Prior Art

In many data processing systems (e.g., computer systems, programmable electronic systems, telecommunication switching systems, control systems, and so forth) very large pin count electrical components (e.g., application specific integrated circuits and processor chips) are assembled on substrates (e.g., printed circuit boards, other flexible substrates, multi-chip modules, and equivalents). One type of packaging that is frequently used for a very large pin count electrical component is what is commonly known as a land grid array (LGA) component. Electrical connections between the LGA component pins and the corresponding conductive pads on the substrate are frequently achieved by compressing an elastomeric insulating material containing several perpendicular conductive channels (e.g., buttons or columns filled with conductive balls or conductive threads).

In order to achieve reliable electrical connection between the pins and the pads, such LGA components are clamped by bolts to the substrate with high perpendicular clamping forces (exceeding several hundred pounds or several hundred newtons of force). However, such large perpendicular forces can cause distortion in the normally flat substrate, and the lack of flatness can cause poor electrical contacts that produce a permanent or an intermittent failure in system operation. Therefore, a bolster plate is frequently attached under a LGA component clamped area of the substrate to support the substrate. The bolster plate provides extra rigidity to the substrate, and the bolster plate helps to maintain the flatness of the substrate under the LGA component.

FIG. 1 illustrates a conventional bolster plate 102 assembled under a substrate (e.g., a printed circuit board) 104, opposite to the attachment of a LGA component 106 by clamp 108 into a socket 110 on the top of the substrate 104. The conventional bolster plate 102 is designed to provide flatness and rigidity to the substrate 104, and provide a uniform load distribution across the contact region of the LGA component 106 when the clamp 108 is bolted to the substrate 104 by bolts 114 and springs 112.

Conventional bolster plates are typically fabricated from a thick, heavy metal plate coated with one or more insulating layers, or they are fabricated from an expensive thermo-set composite material (e.g., a graphite fiber epoxy composite). Frequently, such bolster plates are constrained in thickness and dimensions by the increasing packing densities of nearby substrates. Thick and heavy bolster plates may touch and damage adjacent components on adjacent substrates, and can be especially detrimental to system reliability when the system is subject to shock and vibration. However, thin and light bolster plates may distort and fail to adequately support the substrate when high clamping forces are used for high pin count LGA components. Since the pin counts for IC components are continually increasing, clamping forces for LGA components and the resulting substrate distortions will increase. Without an improved bolster plate to counter such distortions, there will be an increasing number of poor electrical contacts between LGA components and the substrates, resulting in increasing operational and reliability failures.

It would be desirable to provide an improved bolster plate that can supply the necessary mechanical support to a substrate, and maintain the desired flatness of the electrical contact area under an IC component. In addition, this improved bolster plate would preferably be formed from thinner material, due to the reduction in open space adjacent to the substrate in a computer system.

SUMMARY OF THE INVENTION

The present invention provides an improved bolster plate that can supply the necessary mechanical support to a substrate, and maintain the desired flatness of the electrical contact area under an IC component. In addition, this improved bolster plate can be formed from thinner material, compared to the material needed in a conventional bolster plate.

A first aspect of the invention is directed to a method to assemble a pre-curved bolster plate to one side of a substrate having a first side and a second side. The method includes attaching a component to an electrical contact area on the first side of the substrate; and attaching the pre-curved bolster plate to the second side of the substrate, wherein the pre-curved bolster plate is attached to the second side opposite the electrical contact area on the first side of the substrate.

A second aspect of the invention is directed to a method to fabricate a pre-curved bolster plate. The method includes selecting a set of physical dimensions of the pre-curved bolster plate; estimating an initial radius of curvature for the pre-curved bolster plate; modeling the pre-curved bolster plate after assembly on a substrate; estimating a more precise radius of curvature for the pre-curved bolster plate after modeling the pre-curved bolster plate after assembly on the substrate; cutting the pre-curved bolster plate according to the set of physical dimensions; and stamping the pre-curved bolster plate to achieve the more precise radius of curvature.

A third aspect of the invention is directed to an assembled substrate. The assembled substrate includes a substrate having a first and a second side, and an electrical contact area on the first side; an electrical component having a plurality of leads attached to the electrical contact area of the substrate; and a pre-curved bolster plate attached to the second side of said substrate opposite the electrical contact area of the substrate.

These and other objects and advantages of the invention will become apparent to those skilled in the art from the following detailed description of the invention and the accompanying drawings.

DETAILED DESCRIPTION OF PREFERRED EMBODIMENTS OF THE INVENTION

The present invention provides an improved bolster plate that is relatively thinner and lighter in weight than conventional bolster plates. This improved bolster plate is attached to a substrate under an electrical component mounted on the substrate, such as a printed circuit board (PCB) or multi-chip module. While the discussion below is directed to an application of the invention to an LGA assembled on a substrate (e.g., a PCB), the invention can also be applied to other types of electrical components assembled on a flexible substrate (e.g., multi-chip modules, and other substrates upon which electrical components can be assembled).

Figure 1:
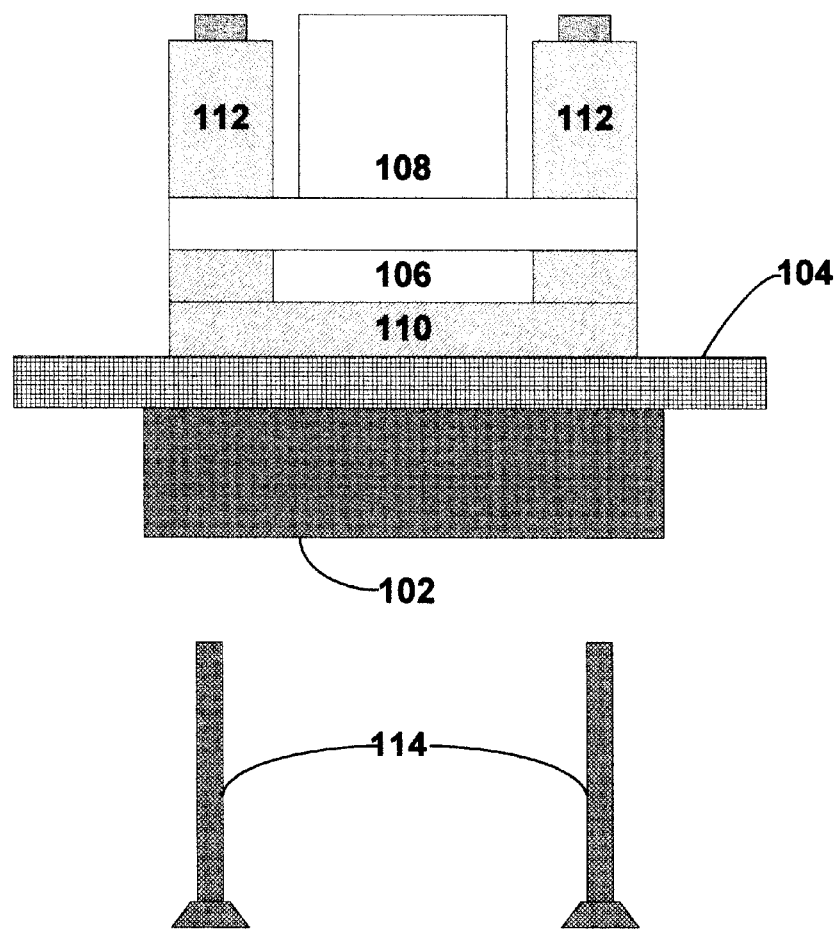
FIG. 1 illustrates a conventional bolster plate prior to assembly under a substrate (e.g., a printed circuit board), opposite to the attachment of a LGA component to the top of the substrate.
Figure 2:
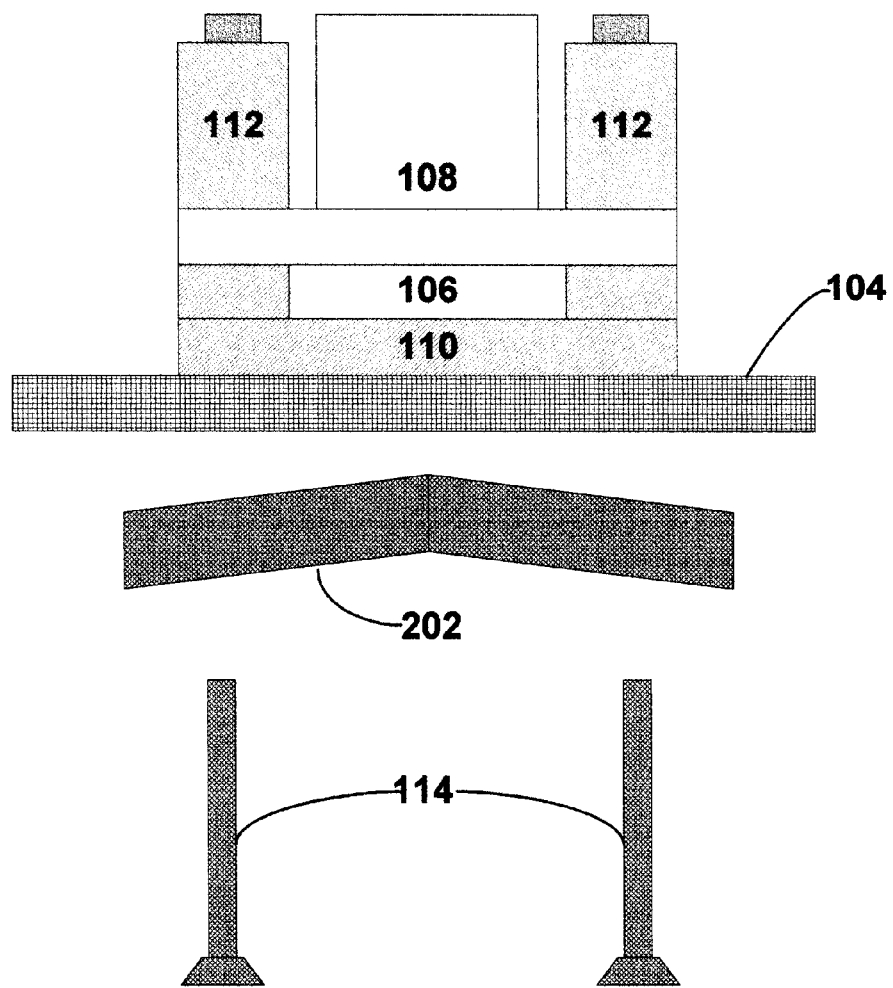
FIG. 2 illustrates a pre-curved bolster plate prior to assembly under a substrate, opposite to the attachment of a LGA component to the top of the substrate.

FIG. 2 illustrates one embodiment of a pre-curved bolster plate 202 prior to assembly under a substrate (e.g., a PCB) 104, opposite to the attachment of a LGA component 106 to the top of the substrate 104. The LGA component 106 is inserted in a socket 110, and the LGA component 106 is clamped to the substrate 104 by clamp 108. The clamping of the LGA component 106 is complete when the clamp 108 is bolted to the substrate 104 by bolts 114 and springs 112. The pre-curved bolster plate 202 is designed to provide flatness and rigidity to the substrate 104, and provide a uniform load distribution across the contact region of the LGA component 106.

The pre-curved bolster plate 202 can be fabricated from the following materials: a stainless steel alloy, a titanium steel alloy, a carbon steel alloy, a magnesium alloy, and an aluminum alloy. One preferred embodiment of the invention has a pre-curved bolster plate fabricated from a stainless steel alloy. Stainless steel is corrosion resistant and would not require plating or painting after stamping. Stainless steel also has sufficient strength and stiffness to allow for net-shape stamping and not require post-stamping heat treatment. This avoids the inherent warpage and distortion associated with heat-treating. The pre-curved bolster plate 202 can be designed to have a spherical, cylindrical, compound multi-spherical, or compound multi-cylindrical curvature (similar to cathedral ceilings) that will counteract the perpendicular clamping force to provide flatness and rigidity to the PCB 104, and provide a uniform load distribution across the contact region of the LGA component 106.

Figure 3A:
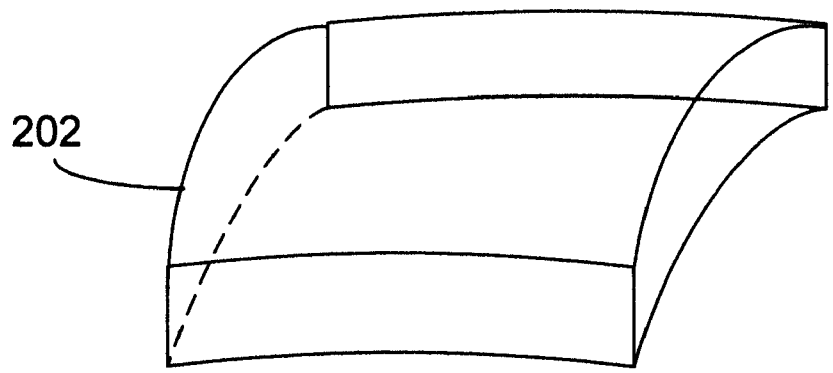
FIG. 3A illustrates one embodiment of a pre-curved bolster plate with a spherical curvature.

FIG. 3A illustrates one embodiment of a pre-curved bolster plate 202 with a spherical curvature. The radius of curvature (e.g., a radius of curvature typically greater than or less than approximately 100 inches or 254 centimeters) can be determined by calculating the curvature in a flat plate of the bolster plate material that would result from the perpendicular clamping force. The spherical curvature can be achieved by stamping an originally flat plate of material. An alternative preferred embodiment of the invention uses a mold to fabricate a bolster plate with a spherical curvature.

Figure 3B:
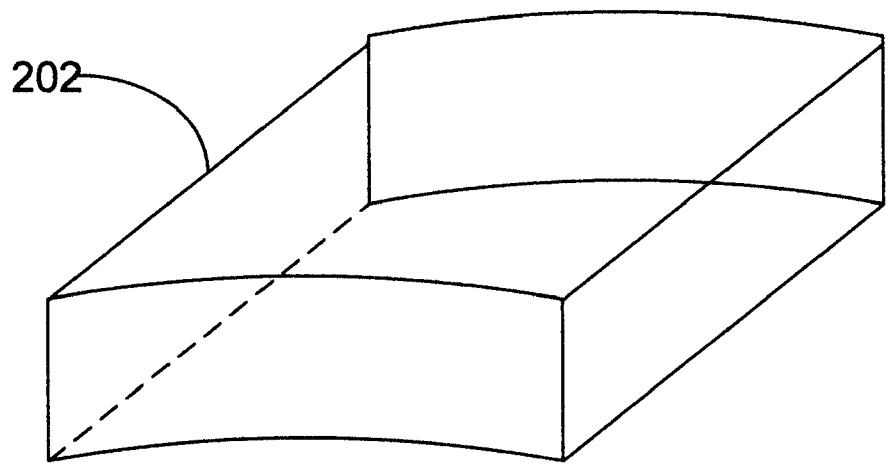
FIG. 3B illustrates one embodiment of a pre-curved bolster plate with a cylindrical curvature.

FIG. 3B illustrates one embodiment of a pre-curved bolster plate 202 with a cylindrical curvature. A bolster plate with a cylindrical curvature may be easier to calculate and stamp, and provide many of the benefits of a bolster plate with a spherical curvature. The cylindrical curvature can be achieved by stamping an originally flat plate of material. An alternative preferred embodiment of the invention uses a mold to fabricate a bolster plate with a cylindrical curvature.

Figure 4:
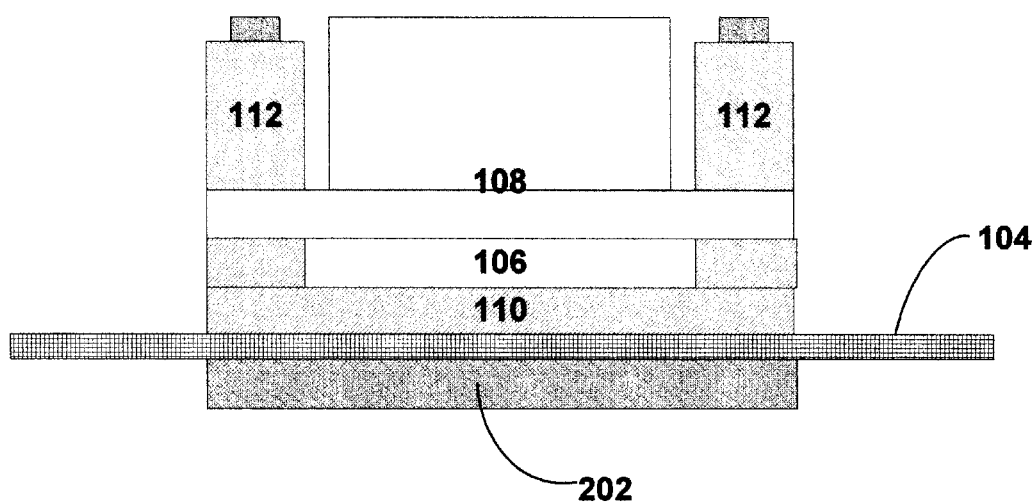
FIG. 4 illustrates a side view of a pre-curved bolster plate with a spherical or cylindrical curvature that is deflected into a flat plate parallel to the plane of the substrate during the application of the perpendicular clamping force to the substrate and pre-curved bolster plate.

FIG. 4 illustrates a side view of a pre-curved bolster plate 202 with a spherical, cylindrical, or compound curvature that is deflected into a flat plate parallel to the plane of the substrate 104 during the application of the perpendicular clamping force to the substrate (e.g., a PCB) 104 and pre-curved bolster plate 202. The LGA component 106 is in a socket 110, and the LGA component 106 is clamped to the substrate 104 by clamp 108. The clamping force on the LGA component 106 is applied when the clamp 108 is bolted to the substrate 104 by bolts 114 and springs 112. The pre-curved bolster plate 202 is designed to provide a uniform load distribution across the contact region of the LGA component 106.

Figure 5:
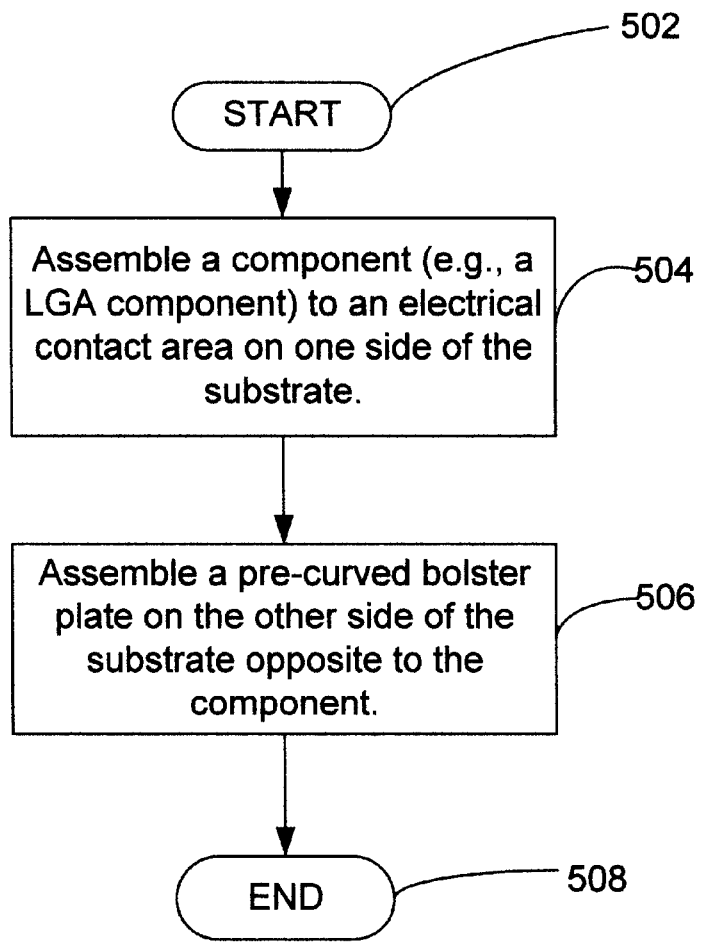
FIG. 5 shows one flow chart for a method to assemble a pre-curved bolster plate on a substrate as shown in FIG. 2 in accordance with one embodiment of the present invention.

FIG. 5 shows one flow chart for a method to assemble a pre-curved bolster plate on a substrate as shown in FIG. 2 in accordance with one embodiment of the present invention. The method starts in operation 502, and is followed by operation 504. In operation 504, a component (e.g., a LGA component) is attached to an electrical contact area on one side of the substrate. Operation 506 is next, where the pre-curved bolster plate is attached on the other side of the substrate, wherein the pre-curved bolster plate is attached opposite to the component and the electrical contact area on the other side of the substrate. Operation 508 is the end of the method.

Figure 6:
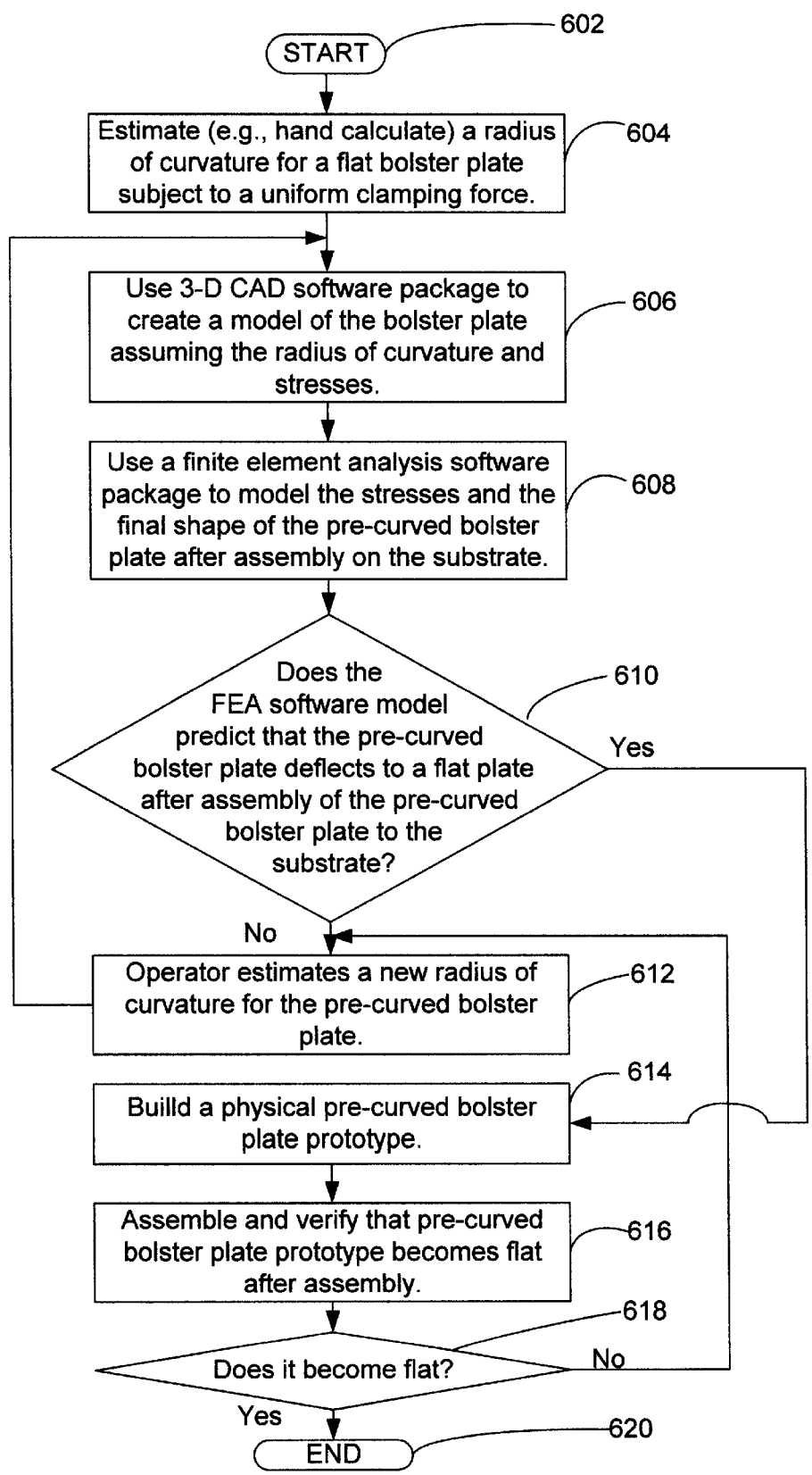
FIG. 6 shows a flow chart for a method to fabricate a pre-curved bolster plate in accordance with one preferred embodiment of the present invention.

FIG. 6 shows a flow chart for a method to fabricate a pre-curved bolster plate in accordance with one preferred embodiment of the present invention. The method starts in operation 602, and is followed by operation 604. In operation 604, a hand calculation is made of the radius of curvature of a flat bolster plate under a uniform load predicted from the clamping force that will be applied to the LGA assembled on a substrate. In operation 606, a 3-D computer aided design (CAD) software package (e.g., Pro/ENGINEER, available from PTC Corporation with corporate headquarters in Needham, Mass.; SolidDesigner, available from CoCreate Software, Inc. with corporate headquarters in Fort Collins, Colo.; SolidWorks, available from SolidWorks Corporation with corporate headquarters in Concord, Mass.; or an equivalent CAD package) is used to create a model of the pre-curved bolster plate assuming the previously estimated radius of curvature. Then operation 608 is next. In operation 608, a finite element analysis (FEA) software package (e.g., Pro/MECHANICA, available from PTC Corporation with corporate headquarters in Needham, Mass.; Ansys, available from Ansys, Inc. with corporate headquarters in Canonsburg, Pa.; Cosmos, available from Structural Research & Analysis Corporation with corporate headquarters in Los Angeles, Calif.; or an equivalent FEA package) is used to model the stresses and the predict the final shape of the pre-curved bolster plate after assembly of the pre-curved bolster plate and the component to the substrate. In operation 610, a test is made to determine if the FEA software package predicts that that the pre-curved bolster plate deflects to a flat plate after assembly. If the test of operation 610 determines that the pre-curved bolster plate will not deflect to a flat plate, operation 612 is next where the operator decides on a new radius of curvature. Then operations 606, 608, and 610 are repeated. If the test of the operation 610 determines that the pre-curved bolster plate will deflect to a flat plate, then operation 614 is next. In operation 614 a physical pre-curved bolster plate prototype is fabricated. Operation 616 is next, where the pre-curved bolster plate is assembled to the substrate to verify that the pre-curved bolster plate will become a flat plate. Then operation 618 is next, where a test is made to determine if the pre-curved bolster plate becomes flat. If the test of operation 618 verifies that pre-curved plate does not become flat, then operation 612 is next. If the test of operation 618 verifies that the pre-curved bolster plate becomes flat, then the method ends in operation 620.

The embodiments of the invention discussed above mainly described examples of substrates assembled with LGA components. However, alternative embodiments of the invention can be applied to other components (e.g., clamped IC components, transformers, power supplies, connectors, or other devices that can cause substrate distortion by an attachment force, clamping force, or from the weight of the component).

The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. A method to fabricate a pre-curved bolster plate, comprising:
   selecting a set of physical dimensions of said pre-curved bolster plate;
   estimating an initial radius of curvature for said pre-curved bolster plate;
   creating a model of said pre-curved bolster plate after assembly on a substrate;
   estimating a more precise radius of curvature for said pre-curved bolster plate after creating said model of said pre-curved bolster plate after assembly on said substrate;
   cutting said pre-curved bolster plate according to said set of physical dimensions; and
   stamping said pre-curved bolster plate to achieve said more precise radius of curvature.

2. The method of claim 1, wherein said pre-curved bolster plate is fabricated from a material selected from the group of materials consisting of:
   a stainless steel alloy,
   a powder-coated spring steel alloy,
   a plated spring steel alloy,
   a painted spring steel alloy,
   a titanium steel alloy,
   a carbon steel alloy,
   a magnesium alloy, and
   an alloy.

3. The method of claim 2, wherein said pre-curved bolster plate is stamped to achieve a spherical curvature.

4. The method of claim 2, wherein said radius of curvature is greater than 100 inches (254 centimeters).

5. The method of claim 2, wherein said pre-curved bolster plate is stamped to achieve a cylindrical curvature.

6. A method for fabricating a bolster plate comprising:
   providing a bolster plate;
   creating a model of the bolster plate having a curved surface with an assumed radius of curvature for the curved surface;
   determining that the model of the bolster plate will deflect to a flat plate after assembly of the modeled bolster plate to a substrate; and
   fabricating a bolster plate having a curved surface with the assumed radius of curvature of the modeled bolster plate.

7. The method of claim 6 additionally comprising
   estimating, prior to creating the model, the initial radius of curvature for when said bolster plate is curved.

8. The method of claim 6, wherein said bolster plate is fabricated from a material selected from the group of materials consisting of:
   a stainless steel alloy,
   a powder-coated spring steel a by,
   a plated spring steel alloy,
   a painted spring steel alloy,
   a titanium steel alloy,
   a carbon steel alloy,
   a magnesium alloy, and
   an aluminum alloy.

9. The method of claim 7, wherein said bolster plate is fabricated from a material selected from the group of materials consisting of:
   a stainless steel alloy,
   a powder-coated spring steel a boy,
   a plated spring steel alloy,
   a painted spring steel alloy,
   a titanium steel alloy,
   a carbon steel alloy,
   a magnesium alloy, and
   an aluminum alloy.

10. The method of claim 9 wherein said curved surface of said fabricated bolster plate comprises a spherical curvature.

11. A method for fabricating a bolster plate comprising:
   (a) providing a bolster plate;
   (b) creating a first model of the bolster plate having a first curved surface with a first assumed radius of curvature for the first curved surface;
   (c) determining that the first model of the bolster plate will not deflect to a flat plate after assembly of the modeled bolster plate to a substrate;
   (d) creating a second model of the bolster plate with a second curved surface having a second assumed radius of curvature for the second curved surface;
   (e) determining that the second model of the bolster plate will deflect to a flat plate after assembly of the second modeled bolster plate to a substrate; and
   (f) fabricating a bolster plate having the second curved surface with second assumed radius of curvature of the second modeled bolster plate.

12. The method of claim 11, wherein said bolster plate is fabricated from a material selected from the group of materials consisting of:
   a stainless steel alloy,
   a powder-coated spring steel a by,
   a plated spring steel alloy,
   a painted spring steel alloy,
   a titanium steel alloy,
   a carbon steel alloy,
   magnesium alloy, and
   an aluminum alloy.

13. The method of claim 11 wherein said curved surface of said fabricated bolster plate comprises a spherical curvature.

14. The method of claim 12 wherein said curved surface of said fabricated bolster plate comprises a spherical curvature.

15. A method for fabricating a bolster plate comprising the following steps:
   (a) providing a bolster plate;
   (b) creating a model of the bolster plate having a curved surface with an assumed radius of curvature for the curved surface;
   (c) determining that the bolster plate model of step (b) will not deflect to a flat plate after assembly of the bolster plate model to a substrate;
   (d) repeating step (b) for at least one additional model of the bolster plate, with each additional model having a different curved surface and different assumed radius of curvature, until it is determined that a modeled bolster plate will deflect to a flat plate when assembled to a substrate; and
   (f) fabricating a bolster plate having a curved surface with a radius of curvature of the modeled bolster plate of step (d).

16. The method of claim 15, wherein said bolster plate is fabricated from a material selected from the group of materials consisting of:
   a stainless steel alloy,
   a powder-coated spring steel alloy,
   a plated spring steel alloy,
   a painted spring steel alloy,
   a titanium steel alloy,
   a carbon steel alloy,
   magnesium alloy, and
   an aluminum alloy.

17. The method of claim 15 wherein said curved surface of said fabricated bolster plate comprises a spherical curvature.

18. The method of claim 16 wherein said curved surface of said fabricated bolster plate comprises a spherical curvature.

* * * * *